US005596734A

United States Patent [19]
Ferra

[11] Patent Number: 5,596,734
[45] Date of Patent: Jan. 21, 1997

[54] METHOD AND APPARATUS FOR PROGRAMMING EMBEDDED MEMORIES OF A VARIETY OF INTEGRATED CIRCUITS USING THE IEEE TEST ACCESS PORT

[75] Inventor: Lawrence C. Ferra, Phoenix, Ariz.

[73] Assignee: Intel Corporation, Santa Clara, Calif.

[21] Appl. No.: 575,178

[22] Filed: Dec. 19, 1995

Related U.S. Application Data

[63] Continuation of Ser. No. 169,515, Dec. 17, 1993, abandoned.

[51] Int. Cl.$^6$ ........................................... G06F 9/44
[52] U.S. Cl. .................. 395/825; 364/927.8; 364/949; 364/232.8; 395/381
[58] Field of Search ...................... 395/375, 775, 395/800

[56] References Cited

U.S. PATENT DOCUMENTS

| | | | |
|---|---|---|---|
| 5,231,314 | 7/1993 | Andrews | 307/480 |
| 5,237,218 | 8/1993 | Josephson et al. | 307/465 |
| 5,311,520 | 5/1994 | Raghavachari | 371/21.6 |
| 5,412,260 | 5/1995 | Tsui et al. | 326/39 |

OTHER PUBLICATIONS

"IEEE Standard Test Access Port and Boundary–Scan Architecture," IEEE Std. 1149.1–1990 (Includes IEEE Std. 1149.1a–1993) IEEE Computer Society, Oct. 21, 1993.

*Primary Examiner*—David Y. Eng
*Attorney, Agent, or Firm*—Blakely, Sokoloff, Taylor & Zafman

[57] ABSTRACT

The present invention provides a method and apparatus for programming embedded memories or on-chip caches of a variety of integrated circuits through use of the IEEE Test Access Port (TAP) architecture and logic. To accomplish this, the TAP architecture is utilized to serially shift address, data and command information into respective register chains of a RISM ACTION register located within a memory interface unit of the integrated circuit. The TAP architecture includes, among other things, a TAP port, a TAP controller and an instruction register. According to the general method used to program the embedded memories, the external system transmits a plurality of sequential signals to respective register chains of the RISM ACTION register, each sequential signal comprising an instruction specifying a write command, an address specifying a consecutive memory location within the storage means and consecutive data strings to be written to the consecutive memory locations. Next, the instruction, address and data input to the RISM ACTION register chains are transmitted in parallel to corresponding first, second and third core registers disposed within a memory unit of the integrated circuit. Upon receipt of the instruction in the first core register, an interrupt unit interrupts operation of the integrated circuit's processor and transfers processor control to executable code stored in the storage means. The executable code then writes the data stored in the third core register to the memory location specified by the address stored in the second core register in response to execution of the instruction stored in the first register.

10 Claims, 5 Drawing Sheets

METHOD AND APPARATUS FOR PROGRAMMING EMBEDDED MEMORIES OF A VARIETY OF INTEGRATED CIRCUITS USING THE IEEE TEST ACCESS PORT

This is a continuation of application Ser. No. 08/169,515, filed Dec. 17, 1993, now abandoned.

BACKGROUND OF THE INVENTION (1) Field of the Invention

The present invention relates to the field of data processing, and more specifically to methods and apparatus for programming an embedded memory module or on-chip cache of an integrated circuit.

(2) Prior Art

In the past, vendors and users of integrated circuits (IC's) having embedded memories (or on-chip caches) have programmed the memories of the IC's using custom built auto-programming circuits. A typical programming circuit comprises a socket having a plurality of pins configured for receiving the connection pins of a particular IC. This programming circuit is coupled to an external memory device having digital logic means such as a microprocessor or the like in addition to a programming routine stored in memory. The IC to be programmed is inserted into the socket of the programming circuit and the memory device instructed to call the programming routine for writing data stored in a specified memory location of the device to the embedded memory of the IC.

According to second (yet similar) method for programming an IC having embedded memory, a slave-load programmer is provided having a socket designed for receiving a particular family of IC's, dedicated circuitry and logic means for programming the IC, a hard drive or floppy drive (and diskette) for storing the data to be written and an input keyboard for inputting commands to the programmer. The IC to be programmed is inserted into the socket and the programmer is subsequently instructed via the keyboard to write specific data stored in either of the hard drive or the floppy diskette to a specified memory location of the IC.

In utilizing the conventional methods and apparatus described above for programming embedded memories of an IC, the problem arises that only a specific IC or a family of IC's can be programmed with a particular programming circuit or programmer. The reason for this is that the configuration and/or number of pins in addition to the timing specifications for accessing the embedded memories vary from IC family to IC family, and sometimes even between IC's within a particular family. Therefore, the wide variety of IC's available on the market requires a vendor or customer to invest in (if not to design himself) many different types of programming circuits and/or slave-load programmers in order to program the embedded memories of the different IC's which they use.

Accordingly, it would be desirable to provide a standardized method and apparatus for accessing and programming embedded memories (or on-chip caches) of all future IC's so as to eliminate the need for using a plurality of programming circuits and/or programmers for different types of IC's.

It is therefore an object of the present invention to provide a standardized method and apparatus for programming a variety of devices including micro-controllers, EPROMS, FLASHes and EPLDs.

It is another object of the present invention to provide a standardized method and apparatus for programming embedded memories of a plurality of different ICs while minimizing the number of interface pins required for the programming, thereby allowing the ICs to be less complex and less expensive.

It is a further object of the present invention to provide a method and apparatus which enables easy, in-system programming of a variety of ICs during the manufacturing process and reprogramming of the ICs when upgraded software becomes available.

SUMMARY OF THE INVENTION

To accomplish these and other objectives, the present invention provides a standardized method and apparatus for programming embedded memories of a plurality of different ICs utilizing the IEEE Test Access Port (TAP) architecture and logic. The TAP architecture is used to serially shift address, data and command information into respective register chains of a RISM ACTION register located within a memory interface unit of an IC. This register acts as a crucial interface between the TAP architecture and the memory interface unit of the IC for reading and writing data to and from specified memory locations.

The TAP architecture includes, among other things, a TAP port, a TAP controller and an instruction register. The TAP port comprises a plurality of input and output pins for serially transmitting and receiving data and control information to and from the TAP controller and instruction register. The TAP controller contains a synchronous finite state machine that controls the sequence of operations of the TAP circuitry. The instruction register is used to select the test to be performed or the test data register to be accessed or beth by serially shifting an instruction into the register and latching the instruction into the finite state machine at the completion of the shifting.

In utilizing the TAP architecture to perform accesses to embedded memory locations, the TAP controller is first instructed that a RISM ACTION operation is to be performed by serially shifting into the instruction register a RISM ACTION opcode via an input pin. The TAP controller reads the opcode and requests access to the memory bus via the MIU. The MIU disables the CPU as the bus master when the CPU is not performing a memory operation.

Next, the address, data and command bit strings for the memory access are serially shifted into the RISM ACTION register by placing the register between the input and output pins of the TAP port. After the shifting has been completed, the external system asserts an update signal via the TAP controller to the RISM ACTION register and the bit strings are transmitted in parallel to corresponding CORE registers. Normal operation of the IC is interrupted by an interrupt unit, and the interrupt unit transfers processor control from the user's code to RISM micro-code stored within an embedded memory module.

The RISM micro-code then reads the command bit string and executes the command accordingly. By means of sequentially inputting a series of commands in addition to appropriate data and addresses from the external system to the RISM ACTION register, the RISM micro-code can write the data transferred from the external system to the specified memory locations within the embedded memories. In this manner, data stored within a buffer in the external system can be serially transmitted to the IC and programmed into the IC's embedded memory modules.

BRIEF DESCRIPTION OF THE DRAWINGS

The objects, features and advantages of the present invention will become apparent from the following detailed description in which.

DETAILED DESCRIPTION OF THE INVENTION

A method and apparatus for programming embedded memories of a variety of integrated circuits using the IEEE Test Access Port is described. In the following description, numerous details such as specific programming steps, specific electronic components and circuitry, etc., are given in order to provide a thorough understanding of the present invention. It will be obvious, however, to one skilled in the art that not all the details given are required to practice the present invention. In other instances, well-known system components, features, methods and the like are not set forth in detail in order to avoid obscuring the description of the present invention.

According to the present invention, an integrated circuit (IC) such as a microprocessor or a micro-controller (CPU) having an on-chip cache or an embedded memory (i.e., an EPROM, a FLASH or an EPLD) is provided with an input/output (I/O) architecture and associated logic in addition to at least one interface register. The I/O architecture and logic enable the serial input and output of information to and from the IC, while the interface register provides a serial to parallel interface between the I/O architecture and the embedded memories of the IC.

Figure 1:
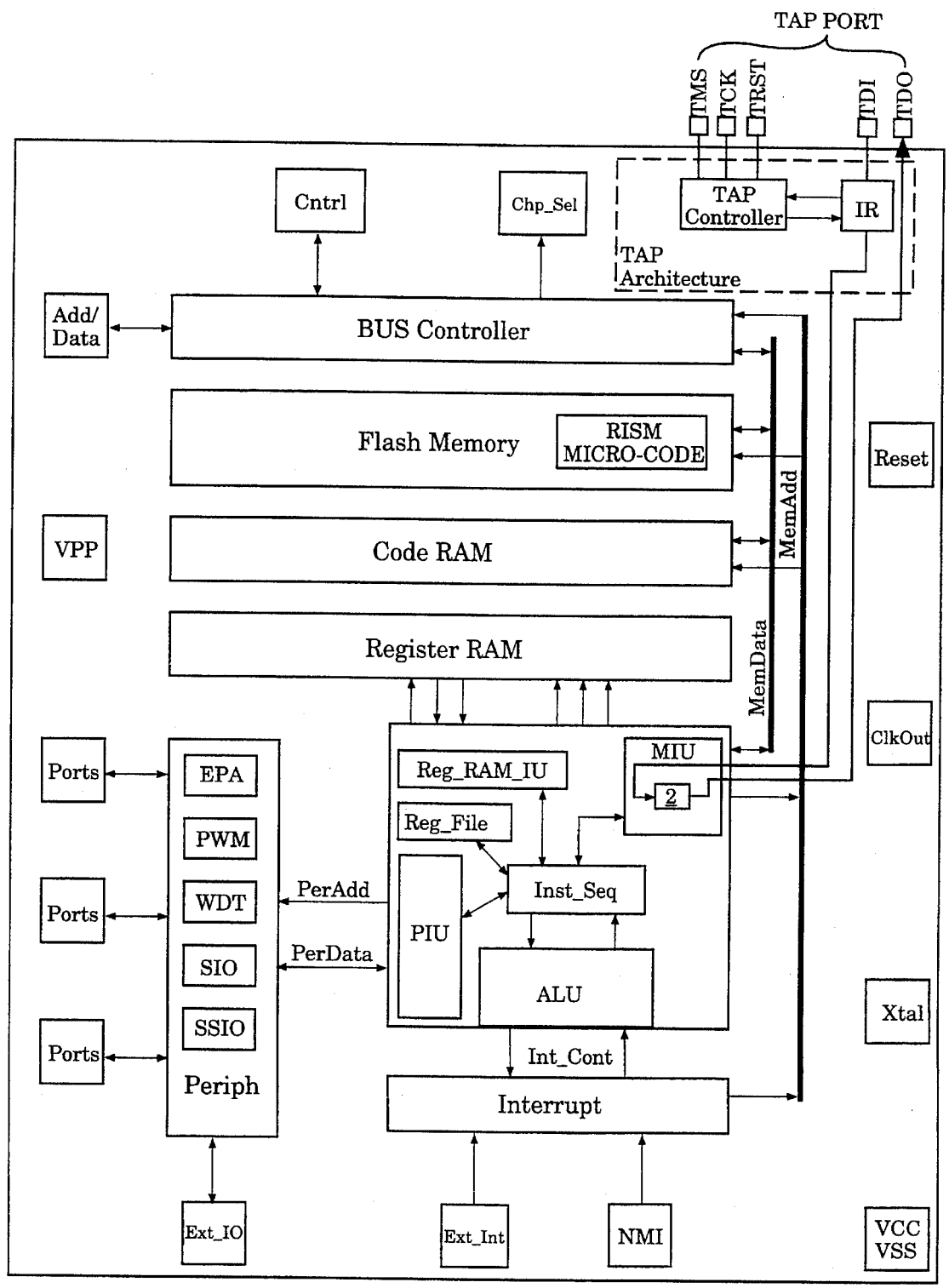
FIG. 1 is a block diagram of an Intel architecture micro-controller integrated circuit of the 80C296 product family showing a generalized implementation of the TAP architecture and its connections to the RISM ACTION register.

According to a preferred embodiment of the present invention, the CPU-based IC to be programmed comprises an 80C296 micro-controller (C296 controller) manufactured by Intel Corporation. As shown in FIG. 1, the C296 controller comprises embedded memory modules including a FLASH memory, a code RAM and a register RAM. The I/O architecture is shown as a functional block entitled "TAP Architecture" coupled to a memory interface unit (MIU) of the C296 controller and having external connections via a "TAP port" to an external system 32 (shown in FIG. 2) having digital logic means. The MIU controls accesses to memory outside of the C296 controller register file (Reg_file) by means of a memory bus (MemData and MemAdd) which allows the core of the C296 controller to interface with the embedded memory modules and the bus controller. De-bugging micro-code comprising a reduced instruction set monitor (RISM) is stored within the test ROM of the FLASH memory module. The RISM micro-code in addition to a RISM register block 2 preferably (but not necessarily) residing within MIU enable reads and writes to memory locations and jumps to other codes stored anywhere in memory for execution. As shown in FIG. 3, the registers of the RISM register block 2 comprises a RISM ACTION register 5 having three register chains 4,6,8 which interface with five RISM special function registers of the IC. The RISM ACTION register 5 forms the interface register of the present invention and includes a RISM CMD register chain 4 (8 bits) coupled in parallel to a corresponding CORE CMD register 21, a RISM ADDR register chain 6 (24 bits) coupled in parallel to a corresponding CORE ADDRESS register 22 and a RISM DATA register chain 8 (32 bits) coupled in parallel to a corresponding CORE DATA register 23.

The RISM ADDR register chain 6 holds the address for memory location reads and writes or the address for branch operations, whereas the RISM DATA register chain 8 holds the data for a write operation or the result data of a read operation. The RISM CMD register chain 4 is used to hold 6 bit macro-instructions ("RISM commands") to be executed by the RISM micro-cede. As shown in the table below, the RISM commands actually form the addresses (shifted fight by two bits) in a break interrupt service routine (ISR) representing the memory locations where the RISM commands are stored.

| Address | Command Label | Description |
| --- | --- | --- |
| 2CH | idle | initial RISM_CMD value after ICE reset |
| 34H | read_byte | read a byte |
| 3CH | read_word | read a word |
| 44H | read_long | read a long |
| 4CH | write_byte | write a byte |
| 54H | write_word | write a word |
| 5CH | write_long | write a long |
| 64H | read_dsp | read DSP accumulator and controls |
| 70H | write_dsp | write DSP accumulator value |
| 84H | write_dsp_ctrl | write DSP accumulator value and controls |
| 90H | call_other | call another RISM-compatible function |
| A8H | execute_other | jump to another RISM-compatible code fragment |
| B0H | go | enter emulation |
| FCH | RISM_prog | special version of call_other which programs the flash memory |

Figure 2:
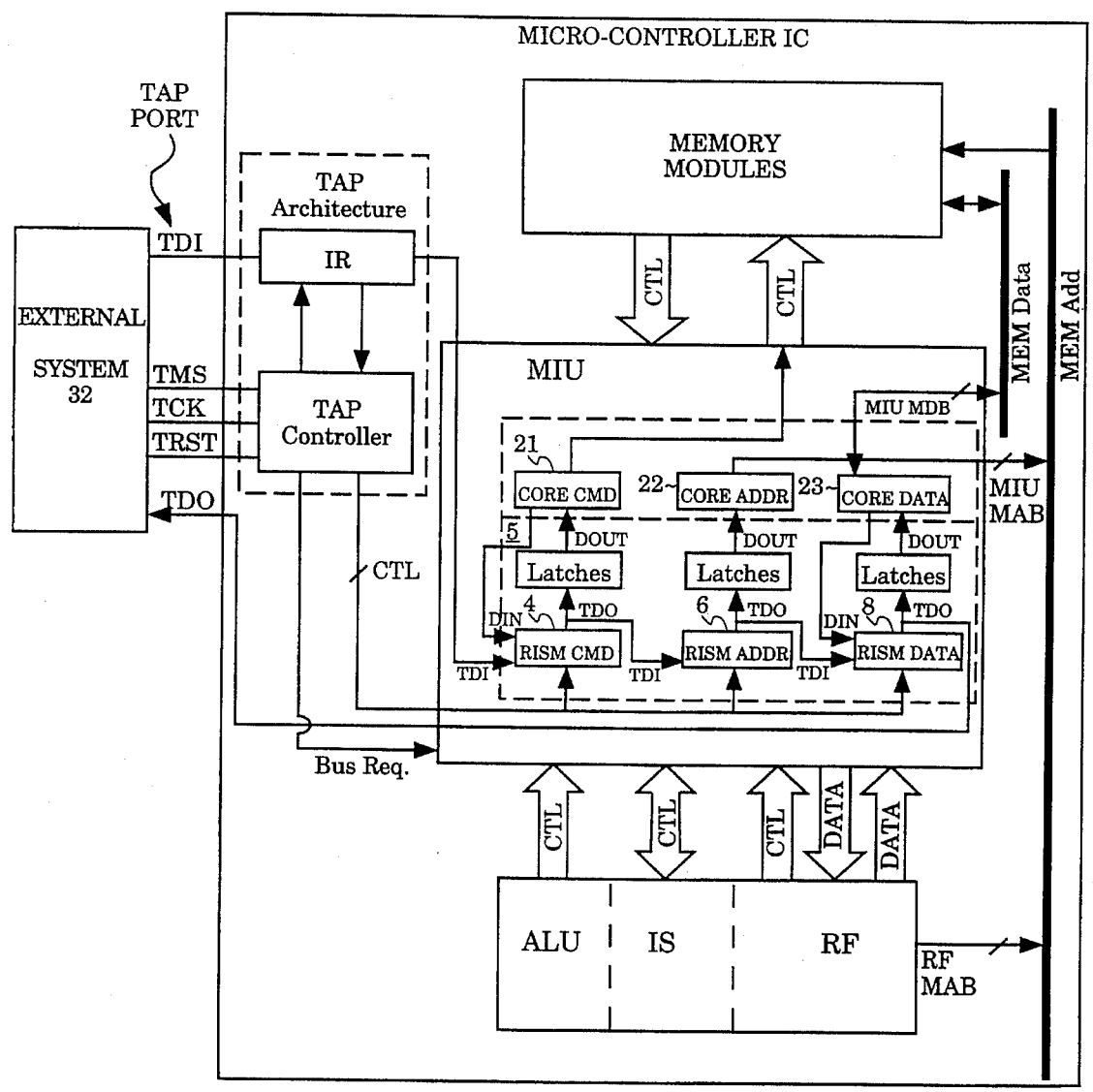
FIG. 2 is a more specific block diagram of the RISM ACTION register and the corresponding CORE registers within the memory interface unit of the C296 micro-controller.
Figure 3:
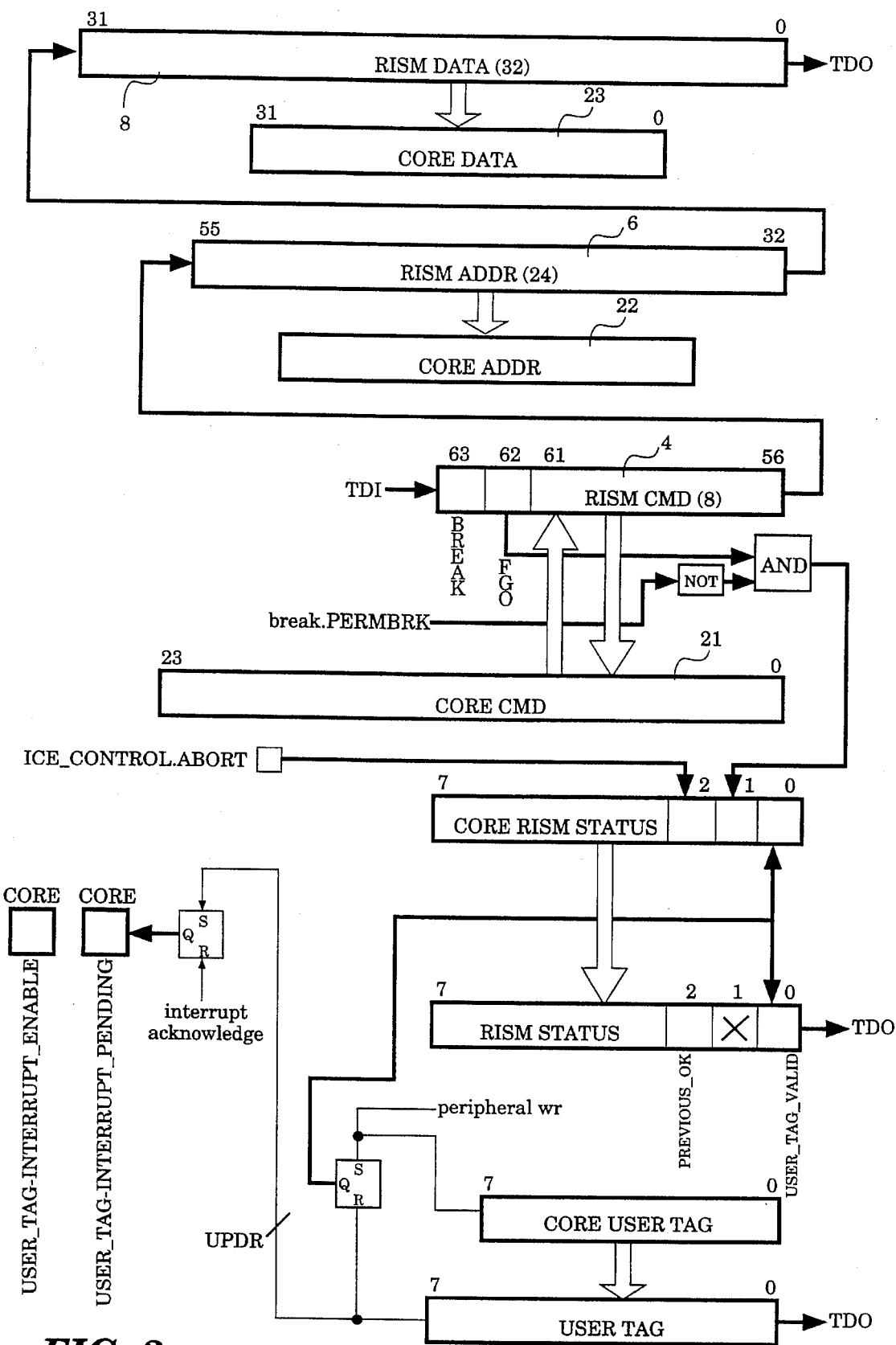
FIG. 3 is a block diagram of the RISM ACTION register chains and the interface with the CORE registers.
Figure 5A:
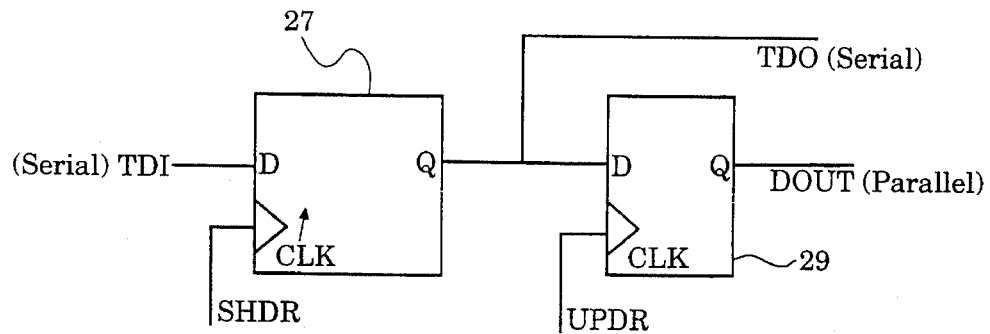
FIG. 5(a) is a schematic diagram of a bit cell for a update only type register utilized in the RISM ACTION ADDR register chain.
Figure 5B:
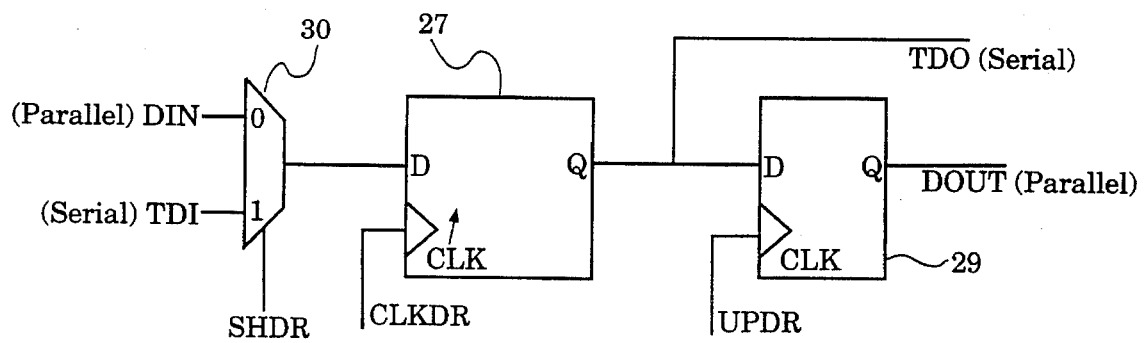
FIG. 5(b) is a schematic diagram of a bit cell for a capture and update type register utilized in the RISM ACTION CMD and RISM ACTION DATA register chains.

In implementation of the RISM ACTION register 5 according to the present invention, as shown in FIG. 2, the RISM ADDR chain 6 of the register 5 comprises "update only" type bit cells (shown in FIG. 5(a)) to form an "UPDATE ONLY" shift register chain capable of serial shifting and parallel writing of bits. The RISM CMD and DATA chains 4, 8, on the other hand, comprise "capture and update" type bit cells (shown in FIG. 5(b)) to form "CAPNUP" shift register chains capable of parallel loading, serial shifting and parallel writing of bits. As can be seen in FIGS. 5(a) and 5(b), each the UPDATE and CAPNUP type bit cells preferably comprise an edge triggered master/slave D-flip-flop 27 and a level sensitive latch 29 coupled together as shown for performing the above-described functions. For the CAPNUP type bit cells, a multiplexor 30 is further added for selecting between the parallel data in (DIN) from the corresponding CORE registers 21, 23 and the serial data in (TDI) from one of the instruction register IR and a previous bit cell. To control the operation of the bit cells of each of the RISM ACTION register chains 4, 6, 8, control signals in the form of a shift signal (SHDR), an update signal (UPDR)

and a clock signal (CLKDR) are transmitted from the external system 32 to each of the bit cells of the respective register chains 4,6,8.

In order to establish a communications interface between the external system 32 and the RISM ACTION register 5, the RISM ACTION register is located such that it is accessible through a single vertical window setting. In the preferred embodiment of the present invention, this is accomplished using the serial interface described in the IEEE document entitled IEEE Standard Test Access Port and Boundary-Scan Architecture (IEEE Standard 1149.1–1190), this document being incorporated herein by reference. This IEEE standard developed by the Test Technology Technical Committee of the IEEE Computer Society sets forth a mechanism (referred to as the "TAP architecture") for accessing the internal workings of an IC in order to 1) test the interconnections between integrated circuits once they have been assembled onto a printed circuit beard, 2) test the IC itself and 3) observe or modify the activity of the IC during its normal operation.

The objective of the Standard is to provide a means for accessing and a means for controlling design-for-test features which are built directly into the IC's themselves. This is accomplished by providing an I/O architecture that enables test instructions and associated test data to be serially fed into the IC, while the results of the execution of such instructions are serially read out. The test logic is designed such that the serial movement of instructions and data, controlled by an external system, is not apparent to those circuit blocks whose operation is controlled by the instruction.

With reference to FIGS. 1 and 2, the TAP port comprises a test clock input pin (TCK) for clocking the TAP controller asynchronously with respect to the CPU's driving clock, a test mode select pin (TMS) for controlling the operation of the TAP controller, a test data input pin (TDI) for serially transmitting data and instruction signals to the internal TAP logic, a test data output pin (TDO) for serially receiving data and instruction signals output from the internal TAP logic and a test reset input pin (TRST) for providing asynchronous initialization of the TAP controller.

The TAP controller contains a synchronous finite state machine that responds to changes of the TMS pin on rising edges of the TCK pin and controls the sequence of operations of the TAP circuitry. The TAP controller is coupled to the plurality of RISM registers and the instruction register IR for controlling the timing and operation of the registers and the serial input and output to and from the TAP architecture. The instruction register IR is used to select the test to be performed or the test data register to be accessed or beth by serially shifting an instruction into the instruction register IR and latching the instruction into the finite state machine at the completion of the shifting. In this implementation, the instruction register IR forms a four bit shift register serially connected to the TDI input, each of the plurality of RISM registers and the TDO output in addition to being connected in parallel to the TAP controller.

Referring again to FIG. 1, the C296 micro-controller further comprises an interrupt unit (INTERRUPT) having break logic for interrupting the controller's current stream of instructions and entering an interrogation mode. To do this, the break logic issues a non-maskable interrupt (NMIE) to the interrupt unit upon detecting an external break interrupt from the external system (i.e., toggling the NMIE pin of the IC) or upon detecting execution of a RISM ACTION command.

In order to enter the interrogation mode by means of executing a RISM ACTION command, the command is serially shifted into the RISM ACTION register 5 via the TAP architecture when the IC is still in normal operation. As shown in FIG. 2, the RISM ACTION command to be shifted in comprises a series of bits forming a RISM data portion (ignored for read operations), a RISM address portion, and a RISM command portion including a FGO bit and a break bit. In order to cause the transition upon execution of the RISM ACTION command, the break bit in the RISM CMD register chain 4 must be set so as to invoke the NMIE.

Upon assertion of an update signal from the TAP controller to the RISM ACTION register 5, the bits in the RISM ACTION register are written in parallel to the corresponding CORE registers 21,22,23. The break logic detects the set break bit upon updating the RISM ACTION register 5 and issues the NMIE to the interrupt unit. The interrupt unit transfers processor control from the user's code to the RISM micro-cede stored at the NMIE vector address within the test ROM. The RISM micro-code then reads the RISM command in the RISM CMD register chain 4 and executes the command accordingly. By means of sequentially inputting a series of RISM commands (such as write_word) in addition to appropriate data and addresses from the external system 32 to the RISM ACTION register 5, the RISM micro-code can write the data transferred from the external system 32 to the specified memory locations within the embedded memories. In this manner, data stored within a buffer in the external system 32 can be serially transmitted to the IC and easily programmed into the IC's embedded memory modules.

Figure 4:
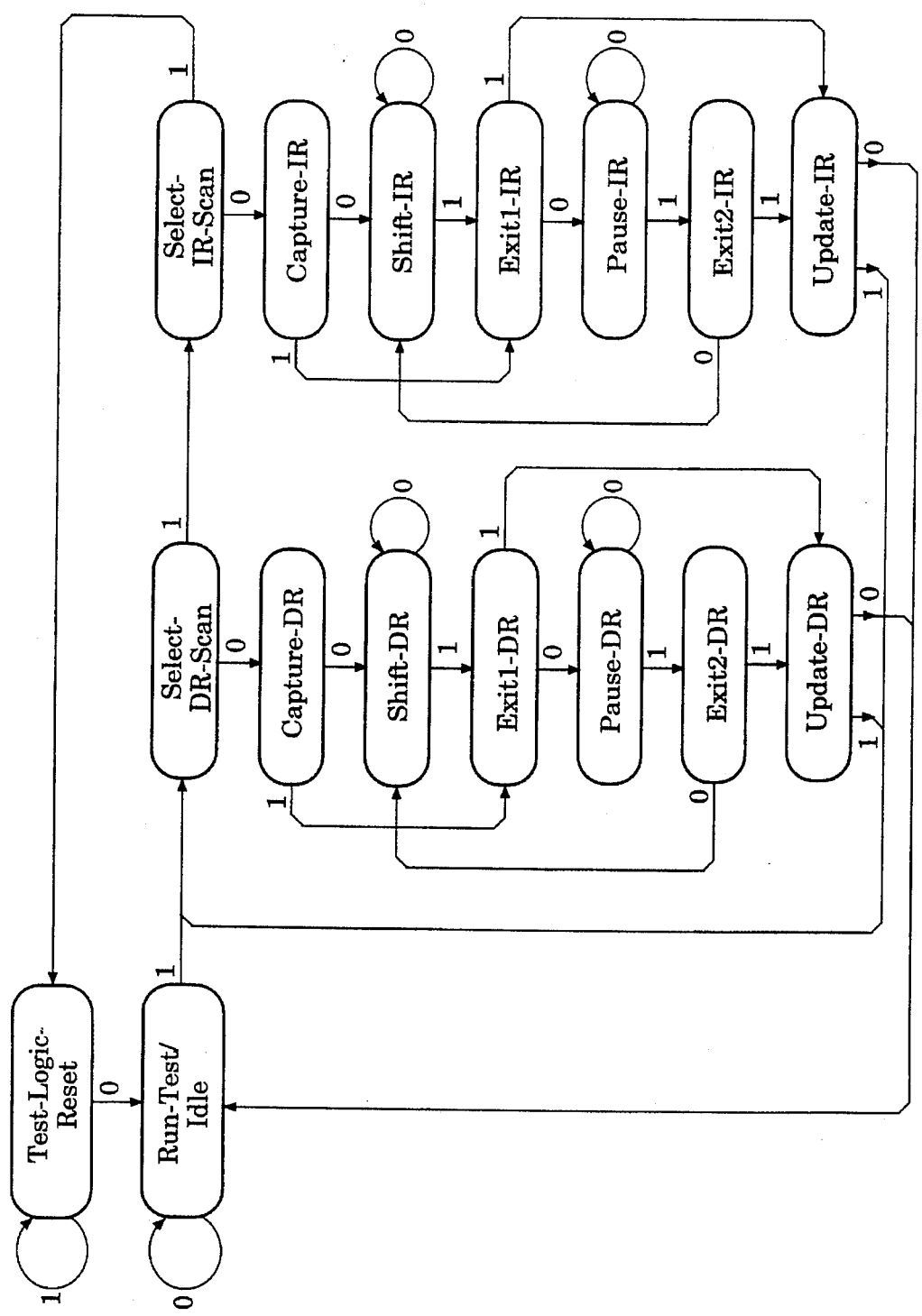
FIG. 4 is a state diagram for the TAP controller pursuant to the IEEE Test Access Port Standard

Utilizing the TAP controller states shown in state diagram of FIG. 4 (which are described in detail in the IEEE 1149.1–1990 Standard), read and write operations to embedded memories of a CPU-based IC via the RISM ACTION register 5 can be performed by sequentially applying binary 1 and 0 signal states to the TMS pin during each dock of the TCK pin to navigate the finite state machine of the TAP controller through the state diagram.

To select the RISM ACTION register 5 as the current, operational register, a RISM ACTION opcode is shifted into the instruction register IR by traversing the TAP controller states of Test-Logic Reset, Run-Test/Idle, Select-DR-Scan, Select-IR-Scan, Capture-IR and Shift-IR. Upon entering the Shift-IR state, a logical 0 signal applied to the TMS pin for four clock cycles so that the opcode bits will be serially shifted in through the TDI input. Next, the TAP controller is instructed to request the memory bus (both MemAdd and MemData) for the RISM ACTION register 5 (via a bus request to the bus controller) by traversing the states of Shift-IR, Exit1-IR, Pause-IR, Exit2-IR, Update-IR and Run-Test/Idle. The bus request actually occurs when the TAP controller reaches the state of Update-IR where the opcode bits within the instruction register IR are transmitted in parallel to the TAP controller which executes the opcode instruction and issues a bus request to the bus controller.

In order to perform a write operation, the TAP controller must be instructed to traverse the states of Select-DR-Scan, Capture-DR and Shift-DR. When the Shift-DR state is reached, a logical 0 signal is applied to the TMS pin for 64 clock cycles so that a 24 bit address string followed by a 32 bit data string (i.e., the data to be programmed) followed by an 8 bit command string (i.e., write_word) is received by the RISM ACTION register 5 from the external system 32 via the TDI input. The write operation will not be requested until the TAP controller enters the UPDATE-DR state where the bits within the flip-flops 27 of the RISM ACTION register chains 4,6,8 are loaded in parallel into the associated level-sensitive latches 29 and subsequently transmitted to the corresponding CORE registers 21,22,23. At this time, the RISM micro-code writes the data bit string from the CORE DATA register 23 to the memory location specified by the address bit string. This process is repeated as many times as is needed to write the entire contents of the external system's storage buffer to the desired memory module.

In order to verify that the data was properly written to the specified memory location, it is possible to read the data back out of the memory module in which it was written. In this case, if the RISM ACTION opcode is not then in effect, the TAP controller will have to be navigated to the SHIFT-IR state and held there for four cycles to shift in the opcode for the RISM ACTION register 5. Next, the TAP controller is instructed to request the memory bus by navigating it to the Run-Test/Idle state in the same manner as was done for the write operation. The TAP controller is then instructed to traverse the states of Select-DR-Scan, Capture-DR and Shift-DR. When the Shift-DR state is reached, a logical 0 signal is applied to the TMS pin for 64 clock cycles so that a 24 bit address followed by a 32 bit data string (ignored for read operations) followed by a RISM command (i.e., read_word) is input to the RISM ACTION register 5 from the external system 32. Finally, the read operation is requested upon entering the update state of the TAP controller. Several clock cycles after the request, the MIU will return the data bite stored in the specified memory location and load them into the CORE DATA register 23.

The returned data bits within the CORE DATA register 23 in addition to the command bits within the CORE CMD register 21 are then loaded into the RISM DATA chain 8 and the RISM CMD chain 4, respectively, by entering the CAPTURE-DR state (where the parallel DIN input to the multiplexor 30 is selected). The TAP controller is next moved to the SHIFT-DR state and held there for 64 clock cycles by the application of a logical 0 signal state to the TMS pin during each cycle. In this manner, the entire contents of the RISM ACTION register 2 is serially output through the TDO output to another storage buffer within the external system 32 where the data read from memory can be compared with that which was previously written to memory.

Accordingly, the present invention provides the ability to program a wide variety of IC's using a single apparatus and a standardized programming method in addition to a serial interface which requires only four active pins. Consequently, future ICs can be made less expensive and can be programmed during the manufacturing process or reprogrammed at a later time when upgraded software becomes available.

While the invention has been described in conjunction with the preferred embodiment, it is evident that numerous alternatives, depictions, variations and uses will be apparent to those skilled in the art in light of the foregoing description. Thus, it is understood that the invention is not to be limited by the foregoing illustrative details, but rather is to be defined by the appended claims.

I claim:

1. In an integrated circuit having processor means for processing instructions, storage means comprising one of an embedded memory and an on-chip cache and a memory unit having a memory bus coupled to the storage means for enabling access to the storage means, an apparatus is provided for programming memory locations of the storage means, the apparatus comprising:

a shift register disposed within the integrated circuit having a command field, an address field and a data field;

an input/output means disposed within the integrated circuit and coupled between an external system outside of the integrated circuit and the shift register for transmission of signals comprising an instruction specifying a write command, an address specifying a memory location within the storage means and data between the external system and the command field, the address field and the data field of the shift register, respectively;

first, second and third registers disposed within the memory unit and being coupled to the shift register for receiving from the command field, address field and data field of the shift register the instruction, address and data, respectively;

executable cede stored within the storage means for executing the instruction stored within the first register and writing the data stored in the third register to the memory location specified by the address stored in the second register; and an interrupt unit coupled to the first register of the memory unit and to the processor means of the integrated circuit for interrupting operation of the processor means upon receipt of the instruction by the first register and transferring processor control to the executable code stored in the storage means.

2. The apparatus of claim 1, wherein the external system programs the storage means of the integrated circuit by serially transmitting a plurality of sequential signals from the external system to the shift register, with each sequential signal comprising a write command, an address specifying a consecutive memory location within the storage means and a consecutive data string corresponding to the consecutive memory locations.

3. The apparatus of claim 2, wherein the write command, the address and the consecutive data string of each sequential signal input to the shift register are transmitted in parallel to the first, second and third registers of the memory unit, respectively, upon transmission of an update signal from the external system via the input/output means to the shift register, the write command comprising a set break bit causing the interrupt unit to transfer processor control from the processor means to the executable code upon receipt of the write command in the first register.

4. The apparatus of claim 3, wherein the executable code writes the consecutive data string stored in the third register of the memory unit to the corresponding consecutive memory location of the storage means in response to execution of the write command by the executable code.

5. The apparatus of claim 1, wherein the input/output (I/O) means of the integrated circuit comprises:

an input register coupled between the external system and the shift register;

an I/O controller coupled to each the external system and the shift register for transmitting signals comprising controls from the external system to the shift resister, the I/O controller further coupled to the input register for receiving signals comprising instructions transmitted from the external system to the input register, the I/O controller having a finite state machine for controlling operation of the input register and the shift register in response to the controls and instructions received from the external system; and an output connection coupled between the shift register and the external system for transmitting signals from the shift register to the external system.

6. The apparatus of claim 5, wherein the command, address and data fields of the shift register each comprise a series of bit cells, with the bit cells of the command field comprising a multiplexor having a first input coupled to one of the input register and a TDO output of a preceding bit cell in the series of bit cells of the command field and having a second DIN input coupled to a corresponding bit cell of the first register of the memory unit, each bit cell of the command field further comprising a flip-flop having as input one of the first and second inputs to the multiplexor and having a TDO output coupled to both a level sensitive latch and a subsequent bit cell in the series of bit cells of one of the command field and address field, the level sensitive latch having a DOUT output coupled to the corresponding bit cell of the first register of the memory unit, the multiplexor, the flip-flop and the level sensitive latch of each bit cell of the command field coupled to the I/O controller for receiving signals comprising controls for controlling operation of the multiplexor, the flip-flop and the level sensitive latch.

7. The apparatus of claim 5, wherein the commend, address and data fields of the shift register each comprise a series of bit cells, with the bit cells of the address field each comprising a flip-flop having an input coupled to a TDO output of a preceding bit cell in the series of bit cells of one of the command field and the address field, each flip-flop further having a TDO output coupled to both a level sensitive latch and a subsequent bit cell in the series of bit cells of one of the address field and the data field, the level sensitive latch having a DOUT output coupled to the a corresponding bit cell of the second register of the memory unit, the flip-flop and the level sensitive latch of each bit cell of the address field coupled to the I/O controller for receiving signals comprising controls for controlling operation of the flip-flop and the level sensitive latch.

8. The apparatus of claim 5, wherein the command, address and data fields of the shift register each comprise a series of bit cells, with the bit cells of the data field comprising a multiplexor having a first input coupled to a TDO output of a preceding bit cell in the series of bit cells of one of the address field and the data field, the multiplexor of each bit cell of the data field further having a second DIN input coupled to a corresponding bit cell of the third register of the memory unit, each bit cell of the data field further comprising a flip-flop having as input one of the first and second inputs to the multiplexor and having a TDO output coupled to both a level sensitive latch and one of a subsequent bit cell in the series of bit cells of the data field and the output connection, the level sensitive latch having a DOUT output coupled to the corresponding bit cell of the third register of the memory unit, the multiplexor, the flip-flop and the level sensitive latch of each bit cell of the data field coupled to the I/O controller for receiving signals comprising controls for controlling operation of the multiplexor, the flip-flop and the level sensitive latch.

9. In an integrated circuit having processor means for processing instructions, a storage means comprising one of an embedded memory and an on-chip cache and a memory unit having a memory bus coupled to the storage means for enabling access to the storage means, a method is provided for programming memory locations of the storage means with input provided by an external system, the method comprising the steps of:

A) transmitting as a first input from the external system to a shift register disposed within the integrated circuit a signal comprising instruction specifying a write command, an address specifying a memory location within the storage means and data, the shift register having a command field, an address field and a data field for storing the instruction, the address and the data transmitted from the external system, respectively;

B) transmitting from the command, address and data fields of the shift; register to first, second and third registers disposed within the memory unit of the integrated circuit the instruction, the address and the data, respectively;

C) transferring processor control from the processor means to executable code stored in the storage means;

D) writing the data stored in the third register to the memory location specified by the address stored in the second register in response to execution of the instruction stored in the first register by the executable cede; and E) repeating steps A), B) and D) until programming of the storage means is complete.

10. In an integrated circuit comprising processor means for processing instructions, a storage means comprising one of an embedded memory and an on-chip cache and a memory unit having a memory bus coupled to the storage means for enabling access to the storage means, a method is provided for programming the storage means of the integrated circuit with input provided by an external system, the integrated circuit having an input/output (I/O) means for transmit flag signals between the external system and the integrated circuit, the I/O means comprising an input register coupled to the external system for receiving the input to the integrated circuit from the external system, an output connection for coupling output from the integrated circuit to the external system and an I/O controller coupled to the input register and the external system for controlling operation of the input register in response to the input to the integrated circuit from the external system, the method comprising the steps of:

A) transmitting as a first serial input an operation code from the external system to the input register;

B) transmitting in parallel the operation code from the input register to the I/O controller, the I/O controller requesting the memory bus in response to execution of the operation code;

C) transmitting from the external system via the input register to a shift register within the integrated circuit a second serial input comprising an instruction specifying a write command, an address specifying a memory location within the storage means and data, the shift register comprising an instruction field, an address field and a data field and being serially coupled between the input register and the output connection for transmitting and receiving signals to and from the I/0 means, the command, address and data fields of the shift register coupled in parallel to corresponding first, second and third registers of the memory unit for reading and writing memory locations of the storage means;

D) transmitting in parallel from the command, address and data fields of the shift register to the first, second and third registers of the memory unit the instruction, the address and the data, respectively;

E) interrupting operation of the processor means upon receipt of the instruction, address and data in the first, second and third registers;

F) transferring processor control from the processor means to executable code stored in the storage means;

G) writing the data stored in the third register to the memory location specified by the address stored in the second register in response to execution of the instruction stored in the first register; and H) repeating steps C), D) and G) until programming of the storage means is complete.

* * * * *

UNITED STATES PATENT AND TRADEMARK OFFICE
CERTIFICATE OF CORRECTION

PATENT NO. : 5,596,734
DATED : January 21, 1997
INVENTOR(S) : Lawrence C. Ferra

It is certified that error appears in the above-indentified patent and that said Letters Patent is hereby corrected as shown below:

In column 2 at line 35 delete "beth" and insert --both--

In column 3 at line 9 delete "registor." and insert --register.--

In column 3 at line 15 delete "the" and insert --their--

In column 4 at line 22 delete "micro-cede." and insert --micro-code.--

In column 4 at line 24 delete "fight" and insert --right--

In column 5 at line 18 delete "beard," and insert --board,--

In column 5 at line 52 delete "beth" and insert --both--

In column 6 at line 18 delete "micro-cede" and insert --micro-code--

In column 6 at line 37 delete "dock" and insert --clock--

In column 7 at line 27 delete "bite" and insert --bits--

UNITED STATES PATENT AND TRADEMARK OFFICE
CERTIFICATE OF CORRECTION

PATENT NO. : 5,596,734
DATED : January 21, 1997
INVENTOR(S) : Lawrence C. Ferra

It is certified that error appears in the above-indentified patent and that said Letters Patent is hereby corrected as shown below:

In column 8 at line 55 delete "resister," and insert --register,--

In column 9 at line 17 delete "commend," and insert --command,--

In column 9 at line 62 insert --an-- following "comprising" and prior to "instruction"

In column 10 at line 22 delete "transmit flag" and insert --transmitting--

In column 10 at line 46 delete "I/0" and insert --I/O--

Signed and Sealed this

Thirteenth Day of May, 1997

Attest:

BRUCE LEHMAN

Attesting Officer

Commissioner of Patents and Trademarks